(12) United States Patent
Kramer

(10) Patent No.: US 6,630,286 B2
(45) Date of Patent: Oct. 7, 2003

(54) PROCESS FOR PREPARING A PRINTING PLATE

(75) Inventor: Charles J. Kramer, Webster, NY (US)

(73) Assignee: ECRM Incorporated, Tewksbury, MA (US)

(*) Notice: Subject to any disclaimer, the term of this patent is extended or adjusted under 35 U.S.C. 154(b) by 0 days.

(21) Appl. No.: 09/839,544

(22) Filed: Apr. 20, 2001

(65) Prior Publication Data
US 2002/0119395 A1 Aug. 29, 2002

Related U.S. Application Data

(63) Continuation-in-part of application No. 09/780,769, filed on Feb. 9, 2001, which is a continuation-in-part of application No. 09/761,509, filed on Jan. 16, 2001, now Pat. No. 6,560,020.

(51) Int. Cl.[7] .................................................. G03F 7/40
(52) U.S. Cl. ........................ 430/309; 430/300; 430/306; 430/302
(58) Field of Search ................................ 430/309, 300, 430/306, 302

(56) References Cited

U.S. PATENT DOCUMENTS

| | | | | |
|---|---|---|---|---|
| 3,836,709 A | * | 9/1974 | Hutchison | 178/6.7 R |
| 4,806,506 A | * | 2/1989 | Gibson, Jr. | 430/309 |
| 5,085,976 A | * | 2/1992 | Gibson, Jr. et al. | 430/306 |
| 5,340,699 A | * | 8/1994 | Haley et al. | 430/302 |
| 5,468,596 A | * | 11/1995 | Loerzer et al. | 430/306 |
| 5,552,262 A | * | 9/1996 | Konermann | 430/309 |
| 5,607,814 A | * | 3/1997 | Fan et al. | 430/306 |

OTHER PUBLICATIONS

Glossary of laser definitions from Rami Arieli: "The Laser Adventure", KSU Physics Education Group, Visual Quantium Mechanics, only date evidenbt is 1997, 6 pages, http://www.phys.ksu.edu/perg/vqm/laserweb/Glossary/Glossary.*

* cited by examiner

Primary Examiner—Cynthia Hamilton
(74) Attorney, Agent, or Firm—Howard J. Greenwald, P.C.; Howard J. Greenwald

(57) ABSTRACT

A process for preparing a printing plate. In this process a photopolymer printing plate is exposed to a source of actinic radiation, and this exposure causes the photopolymer to change at least one of its physical properties. Thereafter, a portion of the photopolymer is removed. The developed printing plate is then irradiated with deep ultraviolet radiation with a wavelength of from about 170 to about 290 nanometers.

14 Claims, 5 Drawing Sheets

PROCESS FOR PREPARING A PRINTING PLATE

CROSS-REFERENCE TO RELATED PATENT APPLICATIONS

This patent application is a continuation-in-part of applicant's copending patent application Ser. No. 09/780,769, filed on Feb. 9, 2001, which in turn was a continuation-in-part of applicant's copending patent application Ser. No. 09/761,509, filed on Jan. 16, 2001, now Pat. No. 6,560,020.

FIELD OF THE INVENTION

A printing plate useful for printing newspapers, magazines and other printed material, and a process for making such printing plate.

BACKGROUND OF THE INVENTION

Printing plates for the high-speed printing of newspapers and magazines are well known. Reference may be had, e.g., to U.S. Pat. No. 6,076,474 (computer to plate printing technique), U.S. Pat. Nos. 5,976,763, 5,962,111 (liquid photopolymerizable resin cured by exposure to actinic radiation), U.S. Pat. No. 5,795,689 (method of making a printing plate for newspaper printing), U.S. Pat. No. 5,223,041 (processing of printing plates to remove unreacted photopolymer), U.S. Pat. No. 5,081,033 (developer composition for newspaper plates), U.S. Pat. Nos. 4,540,649, 4,407,862, 4,289,071, 4,283,481 (phosphine-activated photosensitive compositions), 4,263,392, 4,248,959, 4,234,676, 4,233,391, 4,115,123, 4,115,119, 4,101,324, 4,072,529, 4,044,385, 4,017,183, and the like. The entire disclosure of each of these United States patents is hereby incorporated by reference into this specification.

The printing plates used for newspaper and magazine printing often have aluminum, mylar (polyester), or steel substrates. See, e.g., U.S. Pat. Nos. 6,145,565, 6,076,464, 6,066,424, 6,064,465, 5,967,048, 5,894,319, 5,714,289, 5,712,077, 5,961,104, 5,670,283, 5,637,428, 5,626,996, 5,620,822, 5,589,307, 5,569,573, 5,501,929, 5,432,046, 5,395,721, 5,391,445, 5,282,952, 5,223,041, 5,219,687, 5,208,126, 5,061,598, 4,731,317, 4,645,730, 4,501,810, 4,414,315, and the like. The entire disclosure of each of these United States patents is hereby incorporated by reference into this specification.

One of the problems with prior art printing plates is halftone dot gain associated with the exposure of the plate and halftone dot size loss during the printing process. As is known to those skilled in the art, halftone dot gain is made up of both physical and optical effects, wherein a physical gain is an actual physical change in the size of the dot and optical gain is an optical enhancement due to internal reflections within the composite surrounding the halftone dot. Loss in halftone dot size during the printing process is caused by ink chemistry and physical abrasion of the plate by the printing process. Slight changes in the halftone dot size can cause can cause significant changes in visual color perception. Reference may be had, e.g., to U.S. Pat. Nos. 6,181,439, 6,176,427, 6,098,738, 6,007,967, 5,903,712, 5,888,367, 5,875,288, 5,813,333, 5,763,122, 5,726,772, 5,708,518, 5,659,385, 5,493,327, 5,493,321, 5,382,282, 5,235,432, 5,173,113, 5,146,548, 5,120,624, 4,208,963, 4,004,923, and the like. The entire disclosure of each of these United States patents is hereby incorporated by reference into this specification.

It is an object of this invention to provide a process for preparing a durable printing plate which has improved halftone dot gain and halftone dot size loss properties.

SUMMARY OF THE INVENTION

In accordance with this invention, there is provided a process for preparing a printing plate comprising the step irradiating a developed plate with deep ultraviolet light at a wavelength of from about 170 to about 290 nanometers.

BRIEF DESCRIPTION OF THE DRAWINGS

The invention will be described by reference to the specification, and the drawings, in which like numerals refer to like elements, and in which.

DESCRIPTION OF THE PREFERRED EMBODIMENTS

Figure 1:
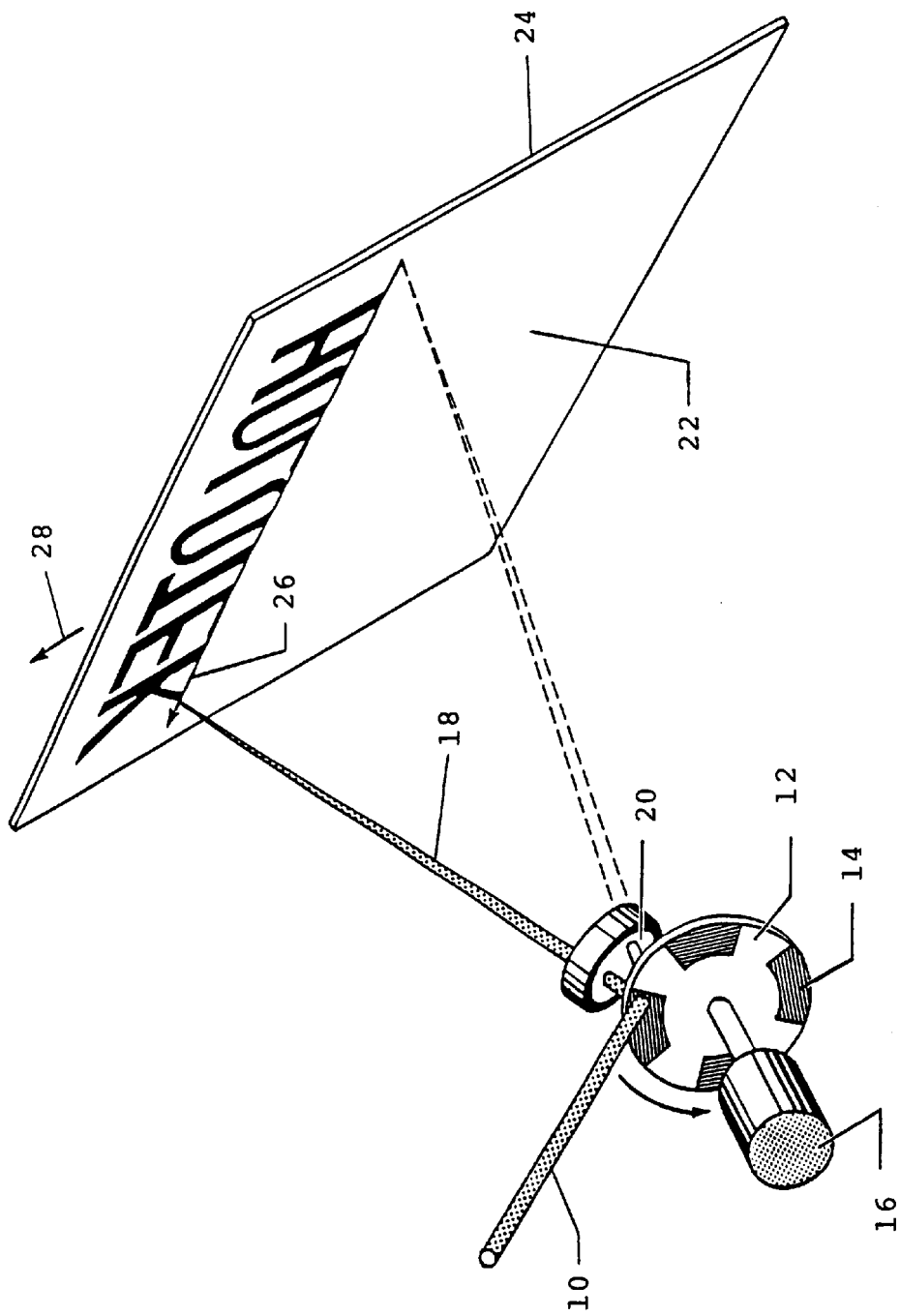
FIG. 1 is a schematic of one preferred device for laser exposing a printing plate.

FIG. 1 a is schematic representation of one preferred method for laser exposing a printing plate. Laser scan imaging systems similar to that depicted in FIG. 1 are shown in U.S. Pat. Nos. 4,289,371, 4,779,944, 4,786,126, 4,826,268 and 4,973,112 and the like. The entire disclosure of each of these United States patents is hereby incorporated by reference into this specification.

Referring to FIG. 1, and in the preferred embodiment depicted therein, it will be seen that an incident beam 10 from a modulated laser source (not shown) is incident to a rotating holographic deflector disk 12 containing four identical diffraction grating facets 14. The disk 12 is rotatably mounted upon a motor assembly 16. The diffracted scanned beam 18, after passing through an F-Theta imaging scan lens 20, is focused onto surface 22 of printing plate 24. The focused beam generates a raster scan line 26 on the surface 22. The printing plate 24 is moved linearly in the direction arrow 28, thereby causing a two-dimensional raster image to be created on the printing plate 24.

As will be apparent to those skilled in the art, the beam 18 causes the photopolymer coating on plate 24 (not shown) to be selectively changed; the degree of change depends, at least in part, on the intensity of the beam 18. This photo-induced change will alter the solubility of the illuminated photopolymer area so that it is either more or less soluble in a specified developer.

The plate 24 is preferably a metal plate with a photopolymer on its surface; and the metal is preferably aluminum having a thickness of from about 150 to about 300 microns. These metal plates are commercially available. Thus, by way of illustration and not limitation, one may use the N91 plate available from the Agfa Company; this plate is sensitive in the 488 to 532 nanometer wavelength region has a sensitivity of 0.18 millijoules per square centimeter. Thus, e.g., one may use the Brilla LP plate available from the Fuji Company; this plate is sensitive in the 488 to 532 nanometer wavelength region, and it has a sensitivity of 0.2 millijoules per square centimeter. Thus, e.g., one may use the Electra-830 plate sold by the Kodak Polychrome Graphic Systems Company; this plate is sensitive in the 800 to 850 nanometer region, and it has a sensitivity of from 140 to 200 millijoules per centimeter squared. Thus, e.g., one may use the LY-5 plate from Mitsubishi Chemical Company; this plate has a sensitivity in 532 nanometer range, and it has a sensitivity of 0.1 millijoules per square centimeter. These and other commercially available plates are described in the Aug. 14, 2000 edition of "The Seybold Report on Publishing Systems" (Post Office Box 644, Media, Pa.).

Figure 2:
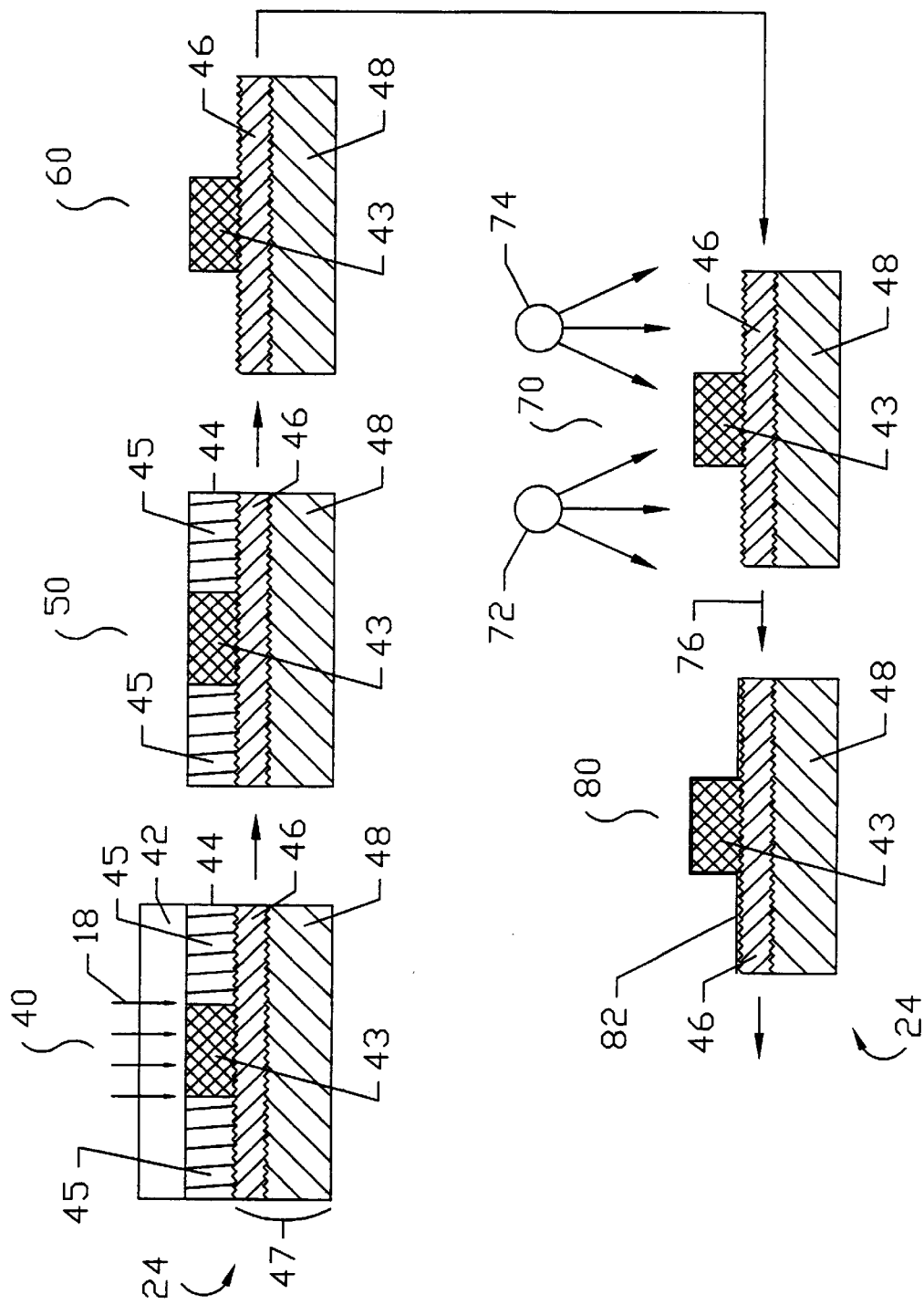
FIG. 2 is a flow diagram of one preferred process of the invention.

FIG. 2 is a schematic representation of one preferred process of this invention. In exposure step 40 of the process, a commercially available plate is exposed. As is known to those skilled in the art, many commercially available polymer plates (such as, e.g., the Agfa N91 plate, the Fuji Brilla LP plate, the Mitsubishi LY-5 plate, and other plates) have an oxygen-barrier coat 42 (see FIG. 2) which protects the photopolymer layer 44 from contact with oxygen. Contact with oxygen tends to decrease the sensitivity of the photopolymer layer 44 as a function of time.

The barrier coat 42 is normally water soluble, and, thus, is readily removed with rinsing with water. However, it is generally not removed until the plate 24 has been exposed to beams 18 (see FIGS. 1 and 2). In one embodiment, plate 24 is a Mitsubishi LY-5 plate, and it is exposed with a frequency doubled YAG laser having a wavelength of 532 nanometers and incident power at the plate in the range of from about 15 to about 35 milliwatts per square centimeter.

Referring again to FIG. 2, and in the preferred embodiment depicted therein, the plate 24 is preferably comprised of a metal substrate 47, such as an aluminum substrate having a thickness generally from about 150 to about 300 microns. In one preferred embodiment, the substrate 47 is comprised of an aluminum support 48 and a hydrophilic layer 46 disposed on one surface thereof. See, e.g., U.S. Pat. No. 5,862,512, the entire disclosure of which is hereby incorporating by reference into this specification.

Although it is preferred to use an aluminum substrate with a hydrophilic printing surface, one may use substrates made out of other materials. Thus, e.g., one may use a Mylar (polyester) substrate.

The hydrophilic layer 46 generally has a thickness of from about 1 to about 10 microns.

Referring again to FIG. 2, the photopolymer layer 44 is comprised of section 43, which has been caused to cross-link (or otherwise increase its density and/or change its solubility properties) after its exposure to actinic radiation 18, and sections 45, which have not been exposed to such actinic radiation and, thus, not so caused to cross-link (or otherwise to increase its density and/or change its solubility properties). In general, the thickness of photopolymer layer 44 is from about 3 to about 12 microns thick.

In pre-development rinse step 50 of the process, the barrier layer 42 is removed by washing it with an aqueous solvent such as, e.g., water.

In development step 60, the non-crosslinked sections 45 are removed from the assembly by contacting it with developer. In one embodiment, the developer is an alkaline-based developer, which contains caustic. It another embodiment, the developer contains 2-phenoxyethanol and diethanolamine. As will be apparent, the developer dissolves and/or causes the removal of sections 45. Thereafter, the developed plate is then washed again with water to remove all traces of developer and any dissolved solids; and then it is dried.

Thereafter, in step 70, the dried developed plate 24 is then subjected to specified radiation. In general, deep ultraviolet radiation in the wavelength region of from about 170 to about 290 nanometers, and preferably from about 240 to about 280 nanometers, is used.

In the embodiment depicted in FIG. 2, lamps 72 and 74 and are used to irradiate the printing surface of the plate 24 with the deep ultraviolet radiation while it is being moved linearly in the direction of arrow 76. In one aspect of this embodiment, this irradiation occurs under ambient temperature and pressure conditions; and the lamps 72 and 74 are disposed less than about 5 inches from the printing surface of plate 24.

In one embodiment, each of lamps 72 and 74 emits substantially the same wavelength spectrum. In another embodiment, each of lamps 72 and 74 emits a spectrum which differs from the other of such lamp. Thus, e.g., lamp 74 might emit in the deep ultraviolet wavelength region between about 240 and about 280 nanometers, and lamp 72 might emit in the ultraviolet region having a wavelength in the range of about 310 to about 380 nanometers. In any case, however, at least one of such lamps emits radiation in the 170 to 290 nanometer region.

As will be apparent, although two lamps 72/74 are illustrated in FIG. 2, one may use fewer or more lamps. Thus, e.g., one may use from 4 to 6 lamps 72/74, or more.

Lamps which produce deep ultraviolet light in the spectrum range of from about 200 to about 290 nanometers are well known. Reference may be had, e.g., to U.S. Pat. Nos. 4,389,482, 4,344,008, 4,312,934, 4,299,911, 4,049,457, and the like. The entire disclosure of each of these United States patents is hereby incorporated by reference into this specification. Thus, by way of further illustration, one may use Germicidal Lamp FG15T8 which is 18 inches long, operates at 0.3 amperes and 56 volts, has a nominal lamp wattage of 15 watts, provides 3.5 watts of ultraviolet radiation at 253.7 nanometers, and has an average life of 8,000 hours.

In addition to lamps 72/74, or in place of lamps 72/74, one may use a deep ultraviolet laser light source such as, e.g., an excimer laser.

In one embodiment, irradiation step 70 occurs in a vacuum. In another embodiment, an X-ray radiation source or a gamma radiation source replaces one or both of the lamps 72 and 74. Additionally, one may use an electron beam source, preferably with plate 24 being disposed in a vacuum.

In one embodiment, while plate 24 is being irradiated by lamps 72/74, it is simultaneously heated to a temperature of from about 50 to about 130 degrees Centigrade.

Without wishing to be bound to any particular theory, applicant believes that this radiation step 70 substantially increases the durability of the developed polymer image 43 on plate 24 with regard to premature dot loss during the printing process. Thus, the plate 24 produced by applicant's process lasts a substantially longer period of printing time, and produces more distinct impressions, when used to print newspapers, magazines, and other printed material, based on an image quality criteria established in the industry (such as halftone dot size loss).

Applicant believes that the inclusion of the radiation step 70 reduces the halftone dot gain problem associated with laser exposure of printing plates. With this process, one can use less laser power to expose the printing plate while still achieving the durability required for most printing operations. Thus, e.g., one may be able to reduce the laser power required by as much as 50 percent, thereby improving image quality and reducing the cost of the laser exposure system.

Referring again to FIG. 2, and in step 80 of the process, a gum coating 82 is coated onto the printing surface of plate 24 before plate 24 is sent to the printing press.

In one embodiment, not shown, the gum coating 82 is affixed to plate 24 prior to radiation step 70.

Figure 3:
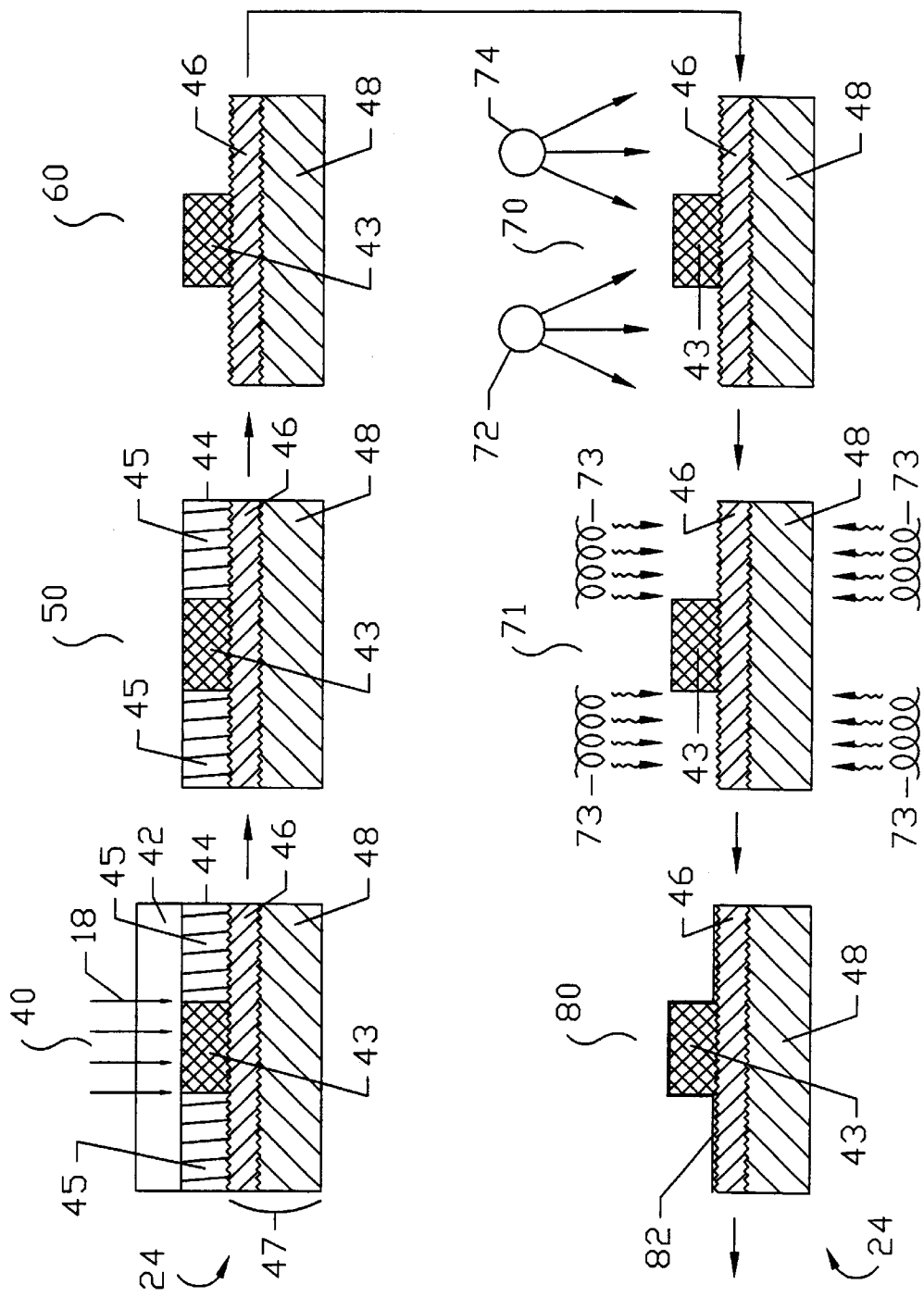
FIG. 3 is a flow diagram of another preferred process of the invention.

FIG. 3 illustrates a process which is substantially identical to the process depicted in FIG. 2 but which differs therefrom in that, in step 71 thereof (which follows radiation step 70), the irradiated plate 24 is heated using heating coils 73 which, preferably, emit both infrared and convection heat. In this step, it is preferred to heat the plate 24 to a temperature between from about 50 to about 130 degrees Centigrade. In one embodiment, the plate 24 is heated to a temperature of from about 100 to about 130 degrees Centigrade.

As will be apparent, other heating means besides heating coils 73 may be used. Thus, e.g., one may use infrared lamps, flame heaters, etc. One may also reverse the sequence depicted in FIG. 3 by using heating step 71 prior to radiation step 70; under these conditions, the plate 24 would enter the radiation step 70 above ambient temperature.

In this specification, applicant has thus far discussed printing plates in which the exposed printing plate is developed by conventional developer. However, as will be apparent to those skilled in the art, applicant's process is also applicable to printing plates in which the photopolymer is removed by other means. Thus, e.g., the photopolymer may be removed by thermal means, using a high powered laser source. In such a case, the exposed plate needs no further development steps prior to the time it is irradiated in step 70.

Figure 4:
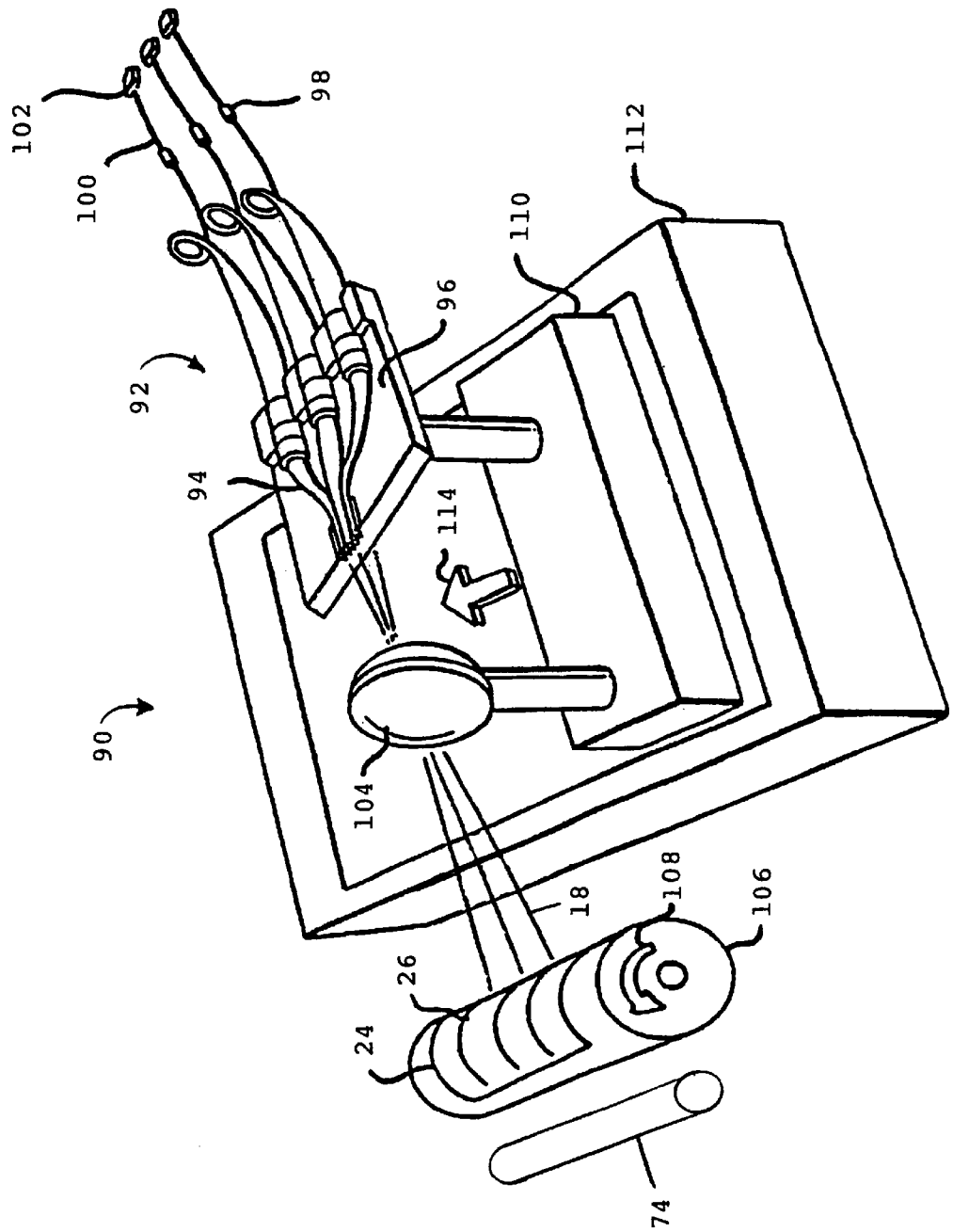
FIG. 4 is a schematic diagram of an external drum platesetter.

With reference to FIG. 4, there is shown in an external drum thermal platesetter 90 that uses high power diode lasers to write images on thermal imaging printing plates. Platesetter 90 is similar to the diode laser printer device 10 disclosed in U.S. Pat. No. 4,900,130, the entire disclosure of which is hereby incorporated by referencing into this specification.

Platesetter 90 includes a scanning head in the form of a fiber optic array 92. Fiber optic array 92 is made up of three operative elements, each of which includes an optical fiber 94 supported on a substrate 96. Each optical fiber 94 is connected by means of an optical fiber connector 98 to another optical fiber 100. Optical fiber connector 98 can be of the type shown in U.S. Pat. No. 4,723,830, the entire disclosure of which is hereby incorporated by reference into this specification. Each of the optical fibers 100 is connected to a diode laser light source 102. Each diode laser light source 102 in array 92 can be modulated according to an information signal in a well-known manner. Light from optical fibers 94 is focused on a plate 24 by means of a lens 104. Both lens 104 and fiber optic array 92 are mounted on carriage 110 which is supported for linear movement on a base 112. The number of operative elements in array 92 is shown as three in FIG. 4. It will be apparent, however, that the number of elements could be more or less than three.

Printing plate 24 is supported on a drum 106 which is driven in the direction of arrow 108. The plate 24 can be, for example, a photopolymer printing plate that requires further development, similar to the steps shown in FIGS. 2 and 3; or it can be a photopolymer printing plate that is physically changed by the incident laser beams in a manner that does not require any further development steps to form the developed plate image, except for possibly washing in a solvent solution such as water or the printing ink fountain solution. As drum 106 is rotated, a set of raster lines 26 are formed on recording medium 24, and at the completion of each set of raster lines 26, carriage 110 is advanced a constant distance in the direction of arrow 114. Successive sets of raster lines 26 are traced on recording medium 24 until a desired image has been completed.

Device 90 of FIG. 4 includes lamp 74 that can be used to illuminate the printing plate 24 while it is attached to the rotating drum 106. Lamp 74 preferably puts out deep ultraviolet light from about 170 to 290 nanometers. While only one lamp 74 is shown in FIG. 4, it is obvious that additional lamps could be included in device 90, as well as lamps which put out ultraviolet light in the range of about 310 to about 420 nanometers. Lamp 74 would be used to irradiate thermal imaging plates which require no additional development steps after being imaged on device 90.

Figure 5:
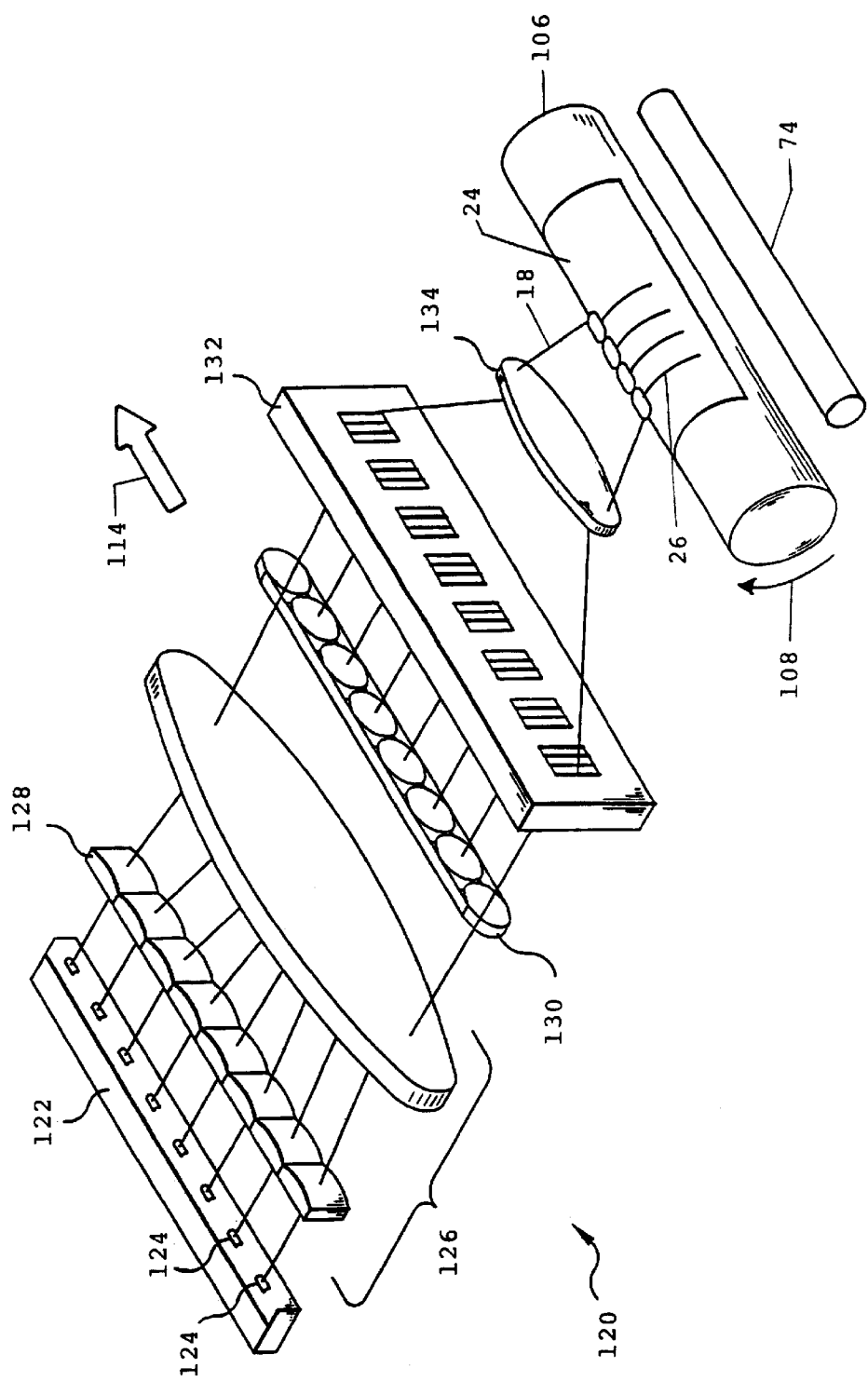
FIG. 5 is a schematic diagram of another embodiment of an external drum platesetter.

With reference to FIG. 5, there is shown another embodiment of an external drum thermal platesetter 120 that uses a high-powered diode laser array in conjunction with a spatial light modulator device 132 to write images on thermal imaging plates. Platesetter 120 is similar to the diode laser platesetter device 10 disclosed in U.S. Pat. No. 5,808,657, the entire disclosure of which is hereby incorporated by reference into this specification.

Platesetter 120 includes a laser array 122, illumination optics 126, a modulator lenslet array 130, a spatial light modulator array 132, a print lens 134, and a printing plate 24 located at the image plane of print lens 134. Laser array 122, is comprised of large area, multimode diode lasers 124. The light from each diode laser in array 122 is not coherent with light from any other diode laser, so the light from the various diode lasers can be superimposed without inducing interference patterns that would degrade the illumination uniformity, and it has minimal filamentation effects. Thus the profile of the light from the diode lasers is fairly uniform, as internal interference effects are minimized.

Multimode diode lasers 124 are driven by a single power supply. Because the diode lasers operate at high power, they cannot be placed in a closely packed formation due to potential thermal cross talk. Thus, the active areas of the diode lasers are separated, and each one occupies a fraction of the array length.

Each of the diode lasers 124 is magnified and imaged in overlapping fashion to flood illuminate the spatial light modulator array 132 and to provide redundancy against failure of any single diode laser. Large area multimode laser diodes are naturally suited for flood illumination. The light profile from the multimode diode lasers is more uniform than the Gaussian profile of the single mode diode lasers and therefore illuminates the modulator array 132 more uniformly. Because a thermal media is a threshold type media, Gaussian spots, with the long tails associated with single mode lasers, are not optimal for imaging thermal sensitive printing plates.

The spatial light modulator array 132 contains individually controllable pixel cells, the transmittance of which can be changed according to an information signal in a well-known manner. The transmitted intensity of each cell in array 132 can be changed from a maximum to a minimum transmittance value, thereby enabling the array 132 to generate a portion of a raster line image having pixel elements equal to the number of pixel cell elements in the array 132. The print lens 134 images the image on array 132 onto the surface of the printing plate 24. The elements 122, 126, 128, 130, 132, and 134 are mounted on a translation carriage (not shown) that linearly moves this assembly of imaging elements in the direction of arrow 114.

Printing plate 24 is supported on a drum 106 which is driven in the direction of arrow 108. The plate 24 can be, for example, a photopolymer printing plate that requires further development, similar to the steps shown in FIGS. 2 and 3, or it can be a photopolymer printing plate that is physically changed by the incident laser beams in a manner that does not require any further development steps to form the developed plate image, except for possibly washing in a solvent solution such as water or the printing ink fountain solution. As drum 106 is rotated, a set of raster lines 26 are formed on the imaging surface of plate 24, and at the completion of each set of raster lines 26, the translation carriage (not shown) to which elements 122, 126, 128, 130, 132, and 135 are mounted is advanced a constant distance in the direction of arrow 114. Successive sets of raster lines 26 are traced on plate 24 until a desired image has been completed.

Device 120 of FIG. 5 includes lamp 74 that can be used to illuminate the printing plate 24 while it is attached to the rotating drum 106. Lamp 74 preferably puts out deep ultraviolet light from about 170 to 290 nanometers. While only one lamp 74 is shown, it is obvious that additional lamps could be included in device 90, as well as lamps which put out ultraviolet light in the range of about 310 to about 420 nanometers. Lamp 74 would be used to irradiate thermal imaging plates which require no additional development steps after being imaged on device 90.

It is understood that the aforementioned description is illustrative only and that changes can be made in the apparatus, in the ingredients and their proportions, and in the sequence of combinations and process steps, as well as in other aspects of the invention discussed herein, without departing from the scope of the invention as defined in the following claims.

I claim:

1. A process for preparing a printing plate, comprising the steps of:
    (a) exposing a photopolymer printing plate to a source of actinic radiation, wherein said actinic radiation causes said photopolymer to change at least one of its physical properties, thereby forming an exposed photopolymer printing plate,
    (b) removing a portion of said photopolymer from said exposed photopolymer printing plate by contacting said photopolymer printing plate with a developer, thereby forming a developed photopolymer printing plate,
    (c) rinsing said plate with an aqueous solvent to remove said developer, and
    (d) irradiating said developed photopolymer printing plate with deep ultraviolet radiation with a wavelength of from about 170 to about 290 nanometers.

2. The process as recited in claim 1, wherein said aqueous solvent is water.

3. The process as recited in claim 1, wherein, after said plate has been rinsed with said aqueous solvent, it is dried.

4. A process for preparing a printing plate, comprising the steps of:
    (a) exposing a photopolymer printing plate comprising a substrate comprised of an aluminum containing layer to a source of actinic radiation, wherein said actinic radiation causes said photopolymer to change at least one of its physical properties, thereby forming an exposed photopolymer printing plate,
    (b) removing a portion of said photopolymer from said exposed photopolymer printing plate, thereby forming a developed photopolymer printing plate, and
    (c) irradiating said developed photopolymer printing plate with deep ultraviolet radiation with a wavelength of from about 170 to about 290 nanometers.

5. The process as recited in claim 4, wherein said aluminum is comprised of a top surface, and bonded to said top surface of said aluminum is a hydrophilic coating.

6. A process for preparing a printing plate comprised of an oxygen barrier disposed over a photopolymer layer, comprising the steps of:
    (a) exposing said printing plate to a source of actinic radiation, wherein said actinic radiation causes said photopolymer to change at least one of its physical properties, thereby forming an exposed printing plate,
    (b) removing said oxygen barrier from said exposed printing plate by rinsing said plate with an aqueous solvent,
    (c) removing a portion of said photopolymer from said exposed printing plate, thereby forming a developed photopolymer printing plate, and
    (d) irradiating said developed photopolymer printing plate with deep ultraviolet radiation with a wavelength of from about 170 to about 290 nanometers.

7. A process for preparing a printing plate, comprising the steps of:
    (a) exposing a photopolymer printing plate to a source of actinic radiation comprised of an array of diode lasers, wherein said actinic radiation causes said photopolymer to change at least one of its physical properties, thereby forming an exposed photopolymer printing plate,
    (b) removing a portion of said photopolymer from said exposed photopolymer printing plate, thereby forming a developed photopolymer printing plate, and
    (c) irradiating said developed photopolymer printing plate with deep ultraviolet radiation with a wavelength of from about 170 to about 290 nanometers.

8. The process as recited in claim 7, wherein said array of diode lasers illuminate said printing plate by means of a fiber optic array.

9. The process as recited in claim 7, wherein said array of diode lasers illuminate said printing plate by means of a spatial light modulator array.

10. The process as recited in claim 7, wherein said array of diode lasers is movable.

11. The process as recited in claim 8, wherein said fiber optic array has a distal output end, and wherein said distal end is movable.

12. The process as recited in claim 9, wherein said spatial light modulator array is movable.

13. A process for preparing a printing plate, comprising the steps of:
    (a) exposing a photopolymer printing plate to a source of actinic radiation, wherein said actinic radiation causes said photopolymer to change at least one of its physical properties, thereby forming an exposed photopolymer printing plate,
    (b) removing a portion of said photopolymer from said exposed photopolymer printing plate, thereby forming a developed photopolymer printing plate, and
    (c) heating said developed photopolymer printing plate to a temperature of from about 50 to about 130 degrees Centigrade while irradiating said developed photopolymer printing plate with deep ultraviolet radiation with a wavelength of from about 170 to about 290 nanometers.

14. A process for preparing a printing plate, comprising the steps of:
    (a) exposing a photopolymer printing plate to a source of actinic radiation, wherein said actinic radiation causes said photopolymer to change at least one of its physical properties, thereby forming an exposed photopolymer printing plate,
    (b) removing a portion of said photopolymer from said exposed photopolymer printing plate, thereby forming a developed photopolymer printing plate, and
    (c) heating said developed photopolymer printing plate to a temperature of from about 50 to about 130 degrees Centigrade after irradiating said developed photopolymer printing plate with deep ultraviolet radiation with a wavelength of from about 170 to about 290 nanometers.

* * * * *